United States Patent
Deise

[11] 3,939,422
[45] Feb. 17, 1976

[54] DYNAMIC ANTENNA TUNER

[75] Inventor: Louis F. Deise, Timonium, Md.

[73] Assignee: Westinghouse Electric Corporation, Pittsburgh, Pa.

[22] Filed: Feb. 12, 1974

[21] Appl. No.: 441,921

[52] U.S. Cl. ................................ 325/163; 325/174
[51] Int. Cl.² .......................................... H04B 1/04
[58] Field of Search .......... 325/105, 163, 172, 174, 325/177, 187; 333/17, 18 R; 336/160, 229; 343/850, 852, 860

[56] References Cited
UNITED STATES PATENTS

| | | | |
|---|---|---|---|
| 3,319,168 | 5/1967 | Olson | 325/163 X |
| 3,509,500 | 4/1970 | McNair et al. | 325/174 X |

Primary Examiner—Benedict V. Safourek
Attorney, Agent, or Firm—M. F. Oglo

[57] ABSTRACT

Disclosed is a dynamic antenna tuning system which may be employed with a high powered transmitter and a very narrow band antenna. An input signal may be applied to the transmitter so as to frequency modulate the transmitter. A unique and compact tuner circuit is connected in series with the antenna whereby inductance changes therefor can be varied by a predetermined amount by means of a plurality of discrete inductances to be selectively switched into the resonant circuit to produce a desired change in the resonant frequency of the antenna sufficient to compensate for deviations in the operating frequency of the transmitter.

4 Claims, 7 Drawing Figures

DYNAMIC ANTENNA TUNER

CROSS REFERENCES TO RELATED PATENTS AND APPLICATIONS

This invention is an improvement over U.S. Pat. Nos. 2,989,624 to M. I. Jacob and 3,319,168 to W. R. Olson, both of which are assigned to the present assignee.

BACKGROUND OF THE INVENTION AND PRIOR ART

The militray services use high power VLF (very low frequency) transmitters for reliable long range communications. Very low frequencies of the radio spectrum are customarily utilized for such transmitters with frequency shift keying as a common mode of transmission, because ground waves in which the energy is transmitted are only slightly subject to fading and to daily and seasonably variations.

However, the antennas which have been commonly used often have such a narrow bandwidth that during keying, the transmitter frequency is so far off antenna resonance that radiated power is reduced and the transmitter is operated inefficiently into a highly reactive load. One effective method of overcoming the foregoing problem has been to dynamically tune the antenna in synchronism with the transmitter frequency. A conventional technique for dynamic tuning of the antenna has been to inductively couple a number of inductance coils to part of a coil comprising the antenna tuner circuit and thus form what is known to those skilled in the art as a Tuner Coil. By shorting the coupled inductance coils with electronic switching devices, the Tuner Coil inductance has been changed by a single fixed amount from L to L−Δ L, and as a result the antenna resonant frequency may be changed from $f$ to $F+\Delta f$. However, for practical purposes the antenna system inductance decreases with increasing frequency and the same Δ L has been known to produce a larger Δ $f$ in the antenna resonant frequency at higher frequencies. As a result, the frequency range is limited for which a conventional Tuner Coil could present an acceptable load phase angle to a transmitter. Extending the frequency range necessitated additionally switching one or more relatively large, space consuming coils in shunt across the Tuner Coil. The shunt coil can cause the same Tuner Coil Δ L of the antenna system to make a lesser Δ $f$ change in the antenna resonant frequency at higher frequency ranges by effectively reducing the value of inductance of the tuner circuit.

Other examples of prior art antenna tuning devices include U.S. Pat. No. 2,989,624 to Mark I. Jacob, issued June 20, 1961 and U.S. Pat. No. 3,319,168 to Wayne R. Olson, issued May 9, 1967, both patents being assigned to the present assignee. U.S. Pat. No. 2,989,624, which discloses apparatus for resonantly tuning an antenna system, utilizes thyratron tube switches to short circuit a plurality of normally open circuited inductance coils to vary the amount of inductance reflected into the antenna resonant load circuit. The disadvantages of employing tube switches include the amount of space consumed by the switches, the heat generated and the relative slowness in which the switches can respond to the rapid keying rate in order to short circuit the normally open circuit inductance coils. In U.S. Pat. No. 3,319,168, this problem is remedied by the use of pairs of Silicon Controlled Rectifiers as switching components. However, both of the aforementioned patents include the inherent shortcoming of changing the center tuning operating frequency of an antenna by utilizing the same, single tuning coil or serially connected tapped segments thereof. Utilizing the same tuning coil or segments thereof has been found to be impractical, because if the system were employed with a relatively high powered transmitter, conventional Silicon Controlled Rectifiers cannot efficiently sustain the resulting power load thereon as a consequence of the present coupling arrangements of the shorted inductance coils to the single coil comprising the conventional tuner circuit.

Accordingly, it is an object of the instant invention to provide improved arrangements for changing the resonant frequency of a very narrow band antenna to compensate for deviations in operating frequency of the transmitter and at a rate in synchronism with the transmitter frequency. It is also an object of the invention to set the deviation of antenna resonant frequency to correspond to the transmitter frequency deviation by the utilization of a unique Tuner Coil arrangement connected in series with the main antenna tuning coil. It is a further object of the instant invention to provide a dynamic antenna tuner which uses the same inductively coupled normally open circuited inductance coils to obtain several different values of inductance change in a relatively small amount of space and without necessitating the use of a conventional space consuming shunt coil. It is a still further object of the invention to employ a Tuner Coil of unique configuration which can have desired self and mutual inductances and proper inductive coupling within a minimum of space.

SUMMARY OF THE INVENTION

This invention relates to a system for dynamically tuning an antenna to the operating frequency of a transmitter. The system includes a tuner circuit connected in series with the antenna to be tuned, magnetic coupling of the transmitter to the tuner circuit and a plurality of normally open circuited inductances to be inductively coupled to the tuner circuit. Each of these inductances has a respective solid state switch means associated therewith, which in the instant invention may be a Silicon Controlled Rectifier arrangement. The switches are adapted to be operated to short circuit the normally open circuited inductances to thereby reflect an inductance into the load circuit and shift the normal resonant frequency of the antenna.

In accordance with the instant invention, the tuner circuit is comprised of a plurality of discrete inductance coils, each coil having a different value of inductance. Each of the coils has a respective normally opened, manually operated switch associated therewith, which may be for example, a relay contactor. The switches are adapted to be operated to connect a respective inductance coil into the tuner circuit in order to provide inductive coupling between at least one of the discrete inductance coils and the plurality of normally open circuited inductances whereby inductance changes for the tuner circuit caused by adding or subtracting a number of inductance coils therein can be varied by a predetermined amount to produce a desired change in the resonant frequency of the antenna which is sufficient to compensate for changes occuring in any operating frequency of the transmitter.

In one embodiment of the instant invention, the variable inductance tuner circuit may be formed from a plurality of the discrete inductance coils concentrically arranged with respect to one another. The normally open circuited inductances may each comprise coils of one or more turns which may be wound concentrically as a single layer over the discrete variable inductance coil arrangement in the same unitary structure to thereby provide a Tuner Coil assembly which will occupy a relatively small amount of space and be suitable for transportable systems where space is limited.

DESCRIPTION OF PREFERRED EMBODIMENT

Figure 1:
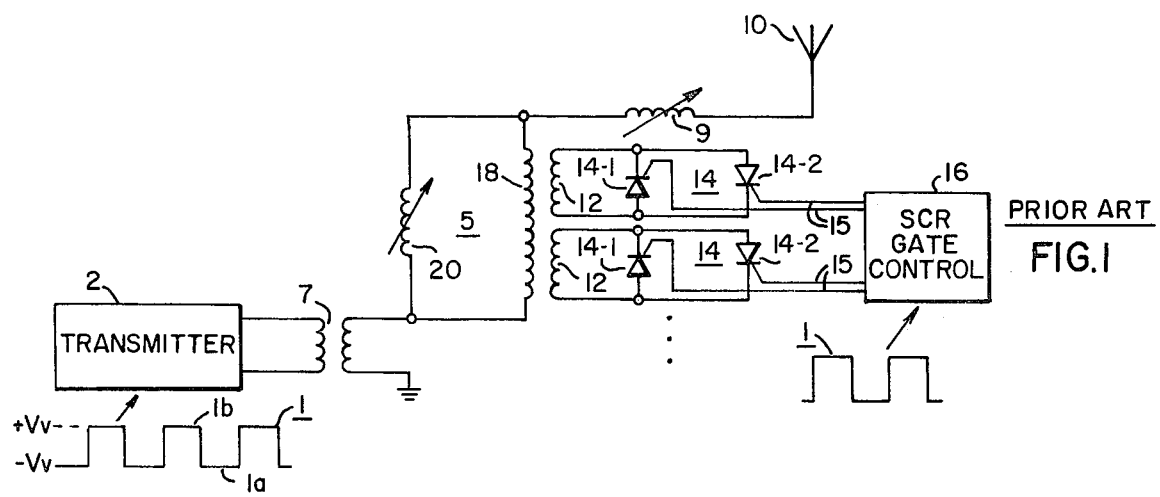
FIGS. 1 and 1a are an electrical schematic and respective equivalent circuit generally representative of the prior art.
Figure 1A:
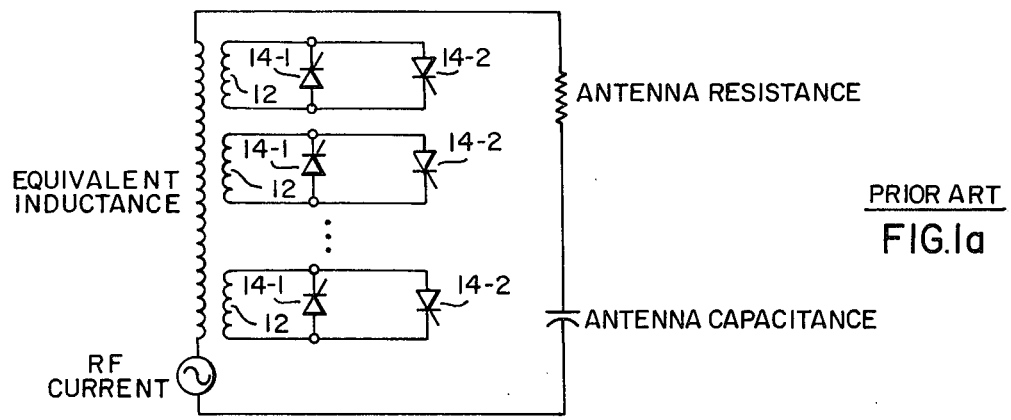

Referring to FIGS. 1 and 1a of the drawings, an electrical schematic and its equivalent circuit are presented to show one form of the prior art of a system for dynamically tuning a sharply resonant radiating antenna 10, such as that having a very narrow bandwidth. A high power, very low frequency (VLF) transmitter 2 including therein an RF power amplifier for delivering RF energy output through the system and to antenna 10 is shown which is to receive an input signal 1 with frequency shift keying as the transmission mode to effectively frequency modulate the transmitter 2. This type of keying is commonly applied to a transmitter when it may be desirable to transmit information coming, for example, from a teletype unit. It has also been known to apply a signal so as to frequency modulate an FM transmitter when it would be desirable to transmit audio or visual information. As illustrated, input signal 1 repeatedly changes voltage levels designated for convenience as −V volts and +V volts, represented by the numerals 1a and 1b respectively. As signal 1 repeatedly cycles from the −V volt level to the +V volt level at the keying rate, a change will occur in the operating frequency of the transmitter 2 which may cause radiated power to be reduced.

The radiating antenna 10 must be returned at a very high rate such as that corresponding to the keying rate of input signal 1 to account for the frequency shift of transmitter 2. Retuning in prior art devices, such as that shown, has been accomplished by a tuner circuit 5 which is magnetically coupled to transmitter 2 by a suitable and conventional transmitter power amplifier RF output coil 7. Tuner circuit 5 is also connected in series with the antenna 10 through a variable main antenna tuning coil 9, which may be manually operated mechanical variometer. Tuner circuit 5, as is common to known prior art tuning assemblies, includes a single tuner coil 18, which may be representative of a transformer primary coil, and additionally may include a shunt coil 20. A plurality, although any suitable number may be used, of normally open circuited inductance coils, which may be representative of a transformer secondary coil, are arranged so as to be inductively coupled to the single tuner primary coil 18 of tuner circuit 5. By shorting each normally opened secondary coil 12 by the operation of a respective pair of gate controlled switches 14 such as solid state Silicon Controlled Rectifiers (SCRs) connected in an inverse parallel relation in conventional fashion, an inductance can be reflected into the tuner circuit 5 and to tuner coil 18 to thus change the inductance for the tuner circuit 5 by a single fixed amount. As the tuner circuit 5 inductance is changed, the normal antenna resonant frequency will also be changed. An example of the foregoing may be found in U.S. Pat. No. 2,989,624, issued to M. I. Jacobs and assigned to the present assignee. The frequency range for which the tuner coil 18 can present an acceptable load phase angle to transmitter 2 can be extended but has necessitated the addition of one or more optional but space consuming shunt coils 20 arranged in parallel with the tuner coil which causes a lesser change in the antenna resonant frequency. It has been customary for shunt coil 20, when used, to be a variometer.

In operation, keying signal 1 is applied both to transmitter 2 and to a conventional SCR gate control apparatus 16 which may be a transformer (not shown) coupled to the gates 15 of switches 14 and is adapted to supply a synchronous trigger signal consisting of alternate positive and negative pulses for firing of the SCR devices in a desired fashion as disclosed, for example, in U.S. Pat. No. 3,319,168 to W. R. Olson, assigned to the present assignee. Only a few milliwatts of power is required at the gate electrode 15 of one respective SCR device of each pair of inverse parallel connected SCR switches 14 so that one switch of the pair arrangement will be conducting or gated on alternate half cycles of the system current which will have an RF frequency and essentially take the form of a sine wave. When an SCR device is conducting it will have a very low forward voltage drop from anode to cathode and therefore can be ideally suited to act as a shorting device. For example, a gate signal from control 16 will first be applied to the gate electrode 15 of one SCR switch 14-2 of each inverse pair of switches 14 during the first half cycle of current when current will be flowing in a direction such that it would pass from anode to cathode when switch 14-2 is rendered conductive to short circuit current through an associated normally open circuited induction coil 12. At the end of the first half cycle, the current flow through switch 14-2 is reduced such that the required turn on or breakover voltage of the SCR can no longer be maintained, and switch 14-2 is consequently shut off or returned to its non-conducting state. At the instant during the beginning of the opposite half cycle, a gate signal will be applied to the gate electrode 14 of SCR switch 14-1 to render it conductive to short circuit current through its associated normally open circuited coil 12 until the end of the opposite half cycle when the breakover voltage can no longer be maintained and switch 14-1 is consequently returned to its non-conducting state. Short circuiting a current through an inductance coil 12 as in the manner described will have a maximum inductive effect on the inductively coupled coil 18 of tuner circuit 5 by reflecting back an inductance from coils 12 into the circuit 5 to reduce the overall inductance therein by a single fixed amount and therefore, change the center tuning operating frequency of antenna 10. When an SCR device is non-conducting because the gate drive has been turned off, its associated inductance switch coil 12 will again be open circuited to have minimum inductive effect on the tuner circuit 5, as no current will pass through the switch and into an associated coil 12. Therefore, in the event an inconsequential inductive effect is desired from coils 12, the keyed input signal 1 is removed from gate control 16, and the gate drive may be turned off from SCR pairs 14 so that both devices will remain inoperative to cause tuner circuit 25 to have a lower resonant frequency than would result had the switches of pairs 14 been alternately triggered into conduction.

Figure 2:
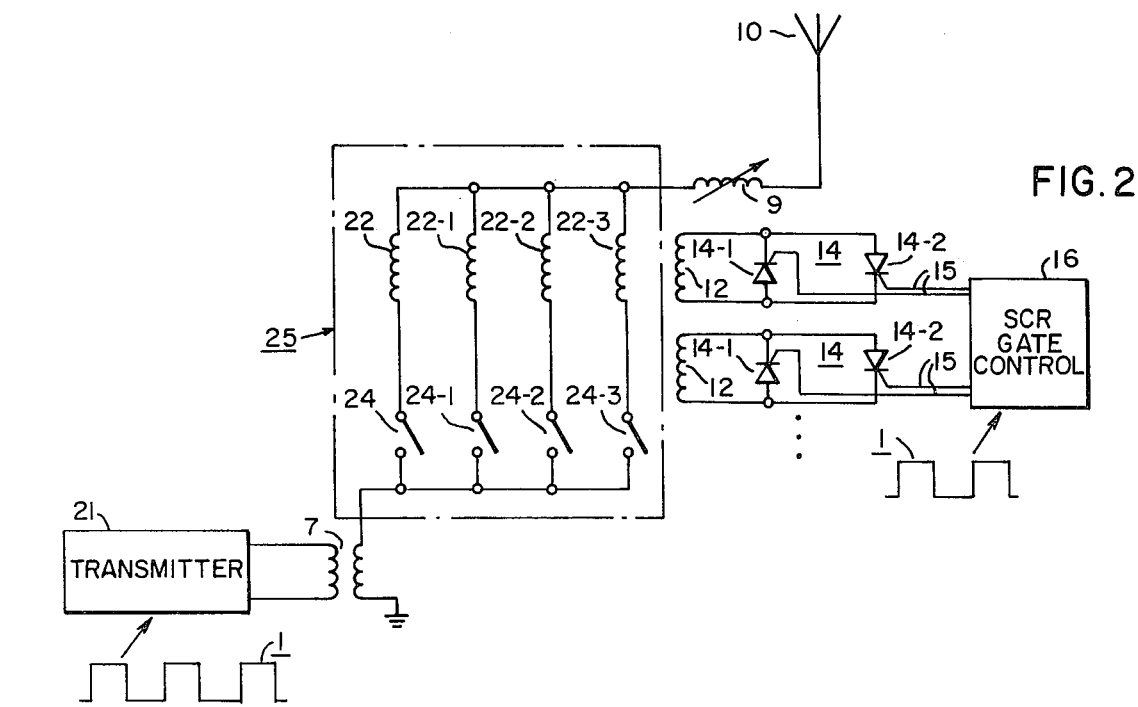
FIG. 2 is an electrical schematic of the dynamic antenna tuning arrangement of the instant invention.

In accordance with the instant invention and now relating to FIG. 2 of the drawings, a unique tuner circuit 25 has been devised which is both more practical and compatible for coupling a relatively high powered transmitter 21 thereto. The prior art circuit arrangement previously described, which utilized a single tuning coil to be inductively coupled to a plurality of normally open circuited inductance coils, has been found not totally suitable for this purpose, because by using a single tuning coil without a conventional shunt coil, the inductance of the conventional tuner circuit is limited to a single fixed change, as previously disclosed, and presently known SCR switch devices cannot be effectively operated to sustain the resulting power loading thereon if such as a high powered transmitter were to be employed because of the excessive currents and voltages which the SCR switches would have to sustain due to the conventional coupling arrangements between the normally open circuited coils 12 and the tuning coil 18 of FIG. 1.

Circuit 25 has been found to dynamically retune the antenna 10 in synchronism with the keying rate as the transmitter operating frequency is shifted. The novel tuner circuit includes a plurality of discrete primary inductance coils 22, 22-1, 22-2, 22-3 to be electrically connected in parallel with respect to one another. Each of the inductance coils 22 – 22-3, which in the instant invention may have several different values of inductance, has a respective normally open switch 24, 24-1, 24-2, 24-3 connected in series therewith. The switches 24 – 24-3 are manually operated switches, such as a relay actuated contactor, so that a human operator may select which of the plurality of coils 22 – 22-3 having the proper coupling factors and inductances. Depending upon the particular operating frequency of the transmitter they are to be connected into the tuner circuit 25 by closing the correct switches to provide inductive coupling between at least one of the inductance coils 22 – 22-3 and the plurality of normally open circuited secondary inductances 12. Although only four inductance coils 22 – 22-3 and respective switches 24 – 24-3 are shown, any suitable number may be used to allow inductance changes of the tuner circuit 25 to be varied by a predetermined amount using the same inductively coupled coils 12 to produce a desired change in the resonant frequency of the antenna 10 which is sufficient to compensate for any change in the operating frequency of the transmitter 21. Thus, with the tuner circuit of this invention, any one of the switches 24 – 24-3 may be selected in order that respective primary coils 22 – 22-3 may be inductively related to the secondary coils 12 in place of using both the conventional tuning coil 18 and the conventional space consuming shunt coil 20, as is common to the prior art. Additionally, the Tuner Coil arrangement of the instant invention thus formed will cause an acceptable load to be presented to the transmitter over a wider band of frequencies than was possible with prior art tuning devices not so using a shunt coil so that the entire operating frequency range might be covered without using the shunt coils as required in prior art construction and with the effect of allowing a more flexible coupling between the coils 12 and coils 22 – 22-3 so that the currents and voltages impressed upon the SCR switch devices 14 can now be more readily adjusted by the predetermined selection of the proper number of discrete coils 22 – 22-3 to be coupled to coils 12.

Figure 3:
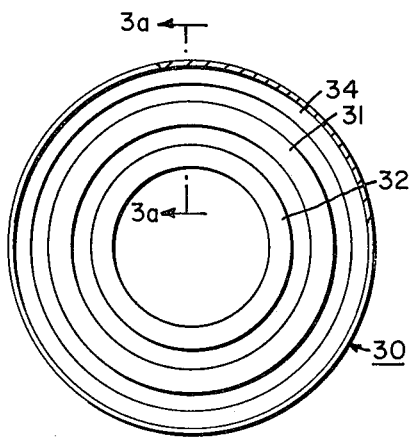
FIG. 3, 3a, 4 and 4a show different embodiments for arranging a plurality of discrete inductances of the antenna resonant circuit being inductively coupled to a plurality of normally open circuited inductance coils in accordance with the instant invention.
Figure 3A:
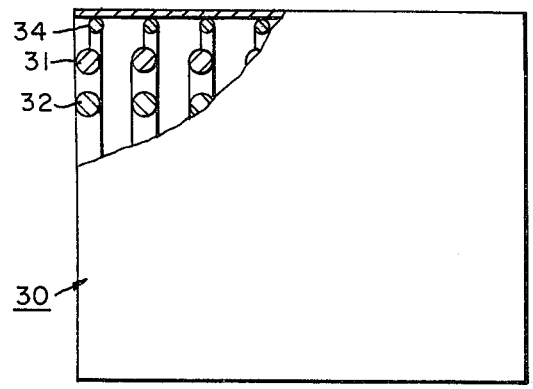
Figure 4:
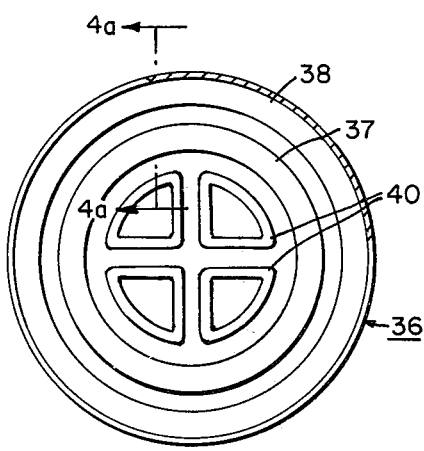

FIGS. 3 to 4 of the drawings show different arrangements for coupling the normally open circuited coils to the discrete inductance coils of the instant invention to thereby eliminate the difficulties, as previously discussed, which arise with conventional coupling arrangements. In FIGS. 3 and 3a, an assembly 30 is shown including a plurality of concentrically wound discrete inductance coils 31 and 32 each which may have a different inductance as previously disclosed. Although only two such coils are shown, any suitable number may be employed. The normally open circuited inductance switch coils 34 comprise generally from 20 to 100 coils of one or more turns each that are wound as a single layer over the inductance coils 31 and 32 so as to form a unitary structure therewith, as illustrated, which occupies a relatively small amount of space. Inductance coil 31 is most closely coupled to the normally open circuited switch coils 34 and may therefore be used for the lower frequency bands. For higher frequency bands, inductance coil 32 or succeeding coils, when employed, would be used.

Figure 4A:
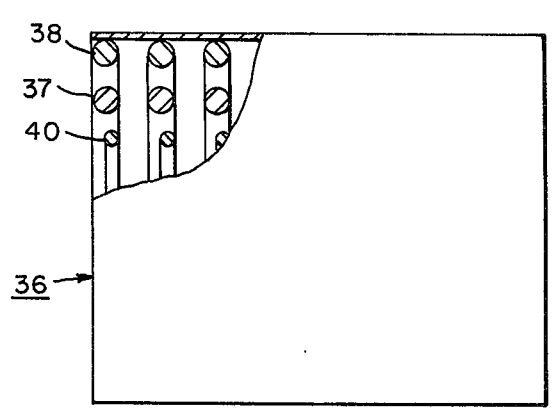

In a tuning assembly 36 to be employed in a large system the voltage induced in any one turn of the normally open circuited coils 40 shown in FIGS. 4 and 4a may exceed the rating of its associated SCR switch device. For this case, the coils 40 may be wound as sectors of a circle such as 90° sector coils as illustrated. The discrete inductance coils 37 and 28 are wound over the outside of coils 40 so as to be part of the same unitary structure and thereby occupy a relatively small amount of space. Inductance coil 38 with a lesser inductive coupling to the normally open circuited coils 40 would be used for a higher frequency band, while closely coupled inductance coil 37 would be used for the lower frequency bands.

The tuning assemblies formed in accordance with the instant invention can provide increased antenna tuning capabilities over an extended frequency range while maintaining a fairly compact construction making it suitable for transportable systems where space is limited.

I claim:

1. For use with a transmitter of the type employing frequency shift keying modulation, a system for dynamically tuning the resonant frequency of the transmitter antenna to alternate between resonant frequencies in synchronism with the repetitive shifts in frequency caused by frequency shift keying modulation, said transmitter having a range of RF output signal operating frequencies which is large relative to the frequency shift caused by frequency shift key modulation, said system comprising:
   a dynamic tuning circuit operatively connected to the transmitter antenna in series circuit therewith,
   means for coupling the transmitter RF output signal into the series circuit of said antenna and dynamic tuning circuit,
   said dynamic tuning circuit comprising a first plurality of inductance and switch pairs, each pair comprising a discrete helical coil and a connect-disconnect switch, each connect-disconnect switch being individually controllable to selectively establish either one or the other of: (A) a connect condition of the helical coil in which the coil is connected into said dynamic tuning circuit so that at least a portion of the transmitter RF output signal is flowing therethrough, and (B) a disconnect condition of the helical coil in which the coil is disconnected from said dynamic tuning circuit with none of the transmitter RF output signal flowing therethrough, all of the helical coils of the first plurality of inductance and switch pairs being disposed in concentric relationship with respect to one another;

a second plurality of inductor and switch pairs, each pair comprising an inductive loop element and a short circuit-open circuit switch, each short circuit-open circuit switch being operative to establish either one or the other of: (i) a short circuit condition of the paired inductive loop element, and (ii) an open circuit condition of the paired inductive loop element, the inductive loop elements of said second plurality of inductor and switch pairs being in inductively coupled relationship with the concentric arrangement of helical coils of the first plurality of inductance and switch pairs; and means for commonly operating all of the short circuit-open circuit switches of said second plurality of inductance and switch pairs in synchronous relationship with the frequency shift keying modulation to alternately short circuit and open circuit all of the inductive loop elements, said inductive loop elements of the second plurality of inductor and switch pairs when in their short circuited condition being operative to reflect a decrease of inductance into any helical coil which is connected into said dynamic tuning circuit.

2. The system of claim 1, wherein each of said discrete helical coils of the first plurality of inductor and switch pairs has a different value of inductance.

3. The system of claim 1, wherein the inductive loop elements of the second plurality of inductor and switch pairs are arranged in a row disposed in a concentric relationship to the concentric arrangement of helical coils of the first plurality of inductor and switch pairs.

4. The system of claim 1, wherein said inductive loop elements of said second plurality of inductor and switch pairs are formed of conductor loops shaped as sectors of a geometric reference circle disposed within the central cavity of the concentric arrangement of helical coils of the first plurality of inductor and switch pairs, said geometric reference circle being concentric with said concentric arrangement of helical coils of said first plurality of inductor and switch pairs, said conductor loops shaped as sectors of geometric reference circles being arranged in at least one row of conductor loops linearly aligned along a direction parallel to the axis of said concentric arrangement of helical coils of the first plurality of inductor and switch pairs.

* * * * *